United States Patent [19]
Ouellet et al.

[11] Patent Number: 6,083,805
[45] Date of Patent: Jul. 4, 2000

[54] METHOD OF FORMING CAPACITORS IN A SEMICONDUCTOR DEVICE

[75] Inventors: Luc Ouellet, Granby; Stephane Blain, Sherbrooke, both of Canada

[73] Assignee: Mitel Corporation, Kanata, Canada

[21] Appl. No.: 09/314,105

[22] Filed: May 19, 1999

[30] Foreign Application Priority Data

May 20, 1998 [GB] United Kingdom .................... 9810797

[51] Int. Cl.⁷ .................................................... H01L 21/20
[52] U.S. Cl. ............................ 438/396; 438/250; 438/393
[58] Field of Search ..................................... 438/396, 239, 438/240, 241, 243, 250, 393, 386

[56] References Cited

U.S. PATENT DOCUMENTS

| | | | |
|---|---|---|---|
| 5,576,240 | 11/1996 | Radosevich et al. | 438/396 |
| 5,858,832 | 1/1999 | Pan | 438/250 |
| 5,985,731 | 11/1999 | Weng et al. | 438/250 |

*Primary Examiner*—Tuan H. Nguyen
*Attorney, Agent, or Firm*—Marks & Clerk

[57] ABSTRACT

A method of forming capacitors in a semiconductor device, involves providing a first insulating layer, providing a first mask with an array of apertures over the insulating layer, and etching an array of holes in the first insulating layer through said apertures in said first mask. A first electrode layer extending into the holes is formed over the first insulating layer. A second dielectric layer extends into the holes on said first electrode layer. A second electrode layer extends into the holes on the dielectric layer. The capacitors are patterned with a second mask. The capacitors can be subsequently connected into the circuit in a sequence of processing steps that only involve the addition two extra masks beyond those conventionally employed in integrated circuit manufacture.

15 Claims, 2 Drawing Sheets

METHOD OF FORMING CAPACITORS IN A SEMICONDUCTOR DEVICE

FIELD OF THE INVENTION

This invention relates generally to semiconductor fabrication, and in particular to a method of forming high value capacitors in a semiconductor device.

BACKGROUND OF THE INVENTION

In order to provide high time constants in RC circuits, it is desirable to fabricate components with values of the resistance R and capacitance C as high as possible. With the trend toward smaller line widths, it becomes increasingly difficult to maintain a high value capacitance because capacitance is proportional to the area of the plates and inversely proportional to their separation.

European patent no. 0,188,946 discloses a method of forming capacitors, in which a sandwich structure is deposited in grooves approximately 5 microns deeps formed in the substrate. While this technique can increase the capacitance relative to a conventional horizontal capacitor, it is does not provide sufficient capacitance for modern devices, for example, using 0.8 micron technology. Also, the method described in this patent does not lend itself to being conveniently integrated into a standard fabrication process.

Co-pending British application no. 9801322.0 describes method of forming capacitors in an integrated circuit wherein a conformal sandwich structure extends into holes formed in insulating layer. The preferred structure employs TiN electrodes with a $TiO_2$ dielectric layer. In this process, it was envisaged that the $TiO_2$ dielectric layer would be formed in the same chamber as the electrode layers. While the structure has highly desirable properties, in large part due to the convenience of working with the same metal and the high dielectric constant of $TiO_2$, the fabrication of the $TiO_2$ layer involves in the same chamber involves certain practical difficulties due to the difficulty of handling oxygen in cryopumps. If adequate precautions are not taken, there is a risk of explosion.

Furthermore, in order to keep the manufacturing costs within economic bounds, it is important to limit the number of additional masking steps required to fabricate the device. Each extra masking step adds to the complexity and thus cost of manufacture.

An object of the invention is to provide a method of making low cost, high value capacitors in integrated circuits.

SUMMARY OF THE INVENTION

According to the present invention there is provided a method of forming a semiconductor comprising the steps of a method of forming capacitors in a semiconductor device, comprising the steps of providing a first insulating layer; providing a first mask with an array of apertures over said insulating layer; etching an array of holes in said first insulating layer through said apertures in said first mask; forming a first electrode layer extending into said holes over said first insulating layer; forming a dielectric layer extending into said holes on said first electrode layer; forming a second electrode layer extending into said holes on said dielectric layer; and pattering said capacitors with a second mask.

This sequence permits a complete manufacturing operation, including the connection to other components on the wafer, for example, transistors and the like, to be carried out with only two additional masking steps. Keeping the number of masking steps to a minimum is important from the point of view of cost, and can make the difference between a commercially viable and non-viable process.

The dielectric layer can be conveniently formed in a separate chamber, for example, as an oxide layer using rapid thermal oxidation at about 700° C. for less than one minute, furnace oxidation at 400–500° C. for about 30 minutes, plasma enhanced chemical vapor deposition (PECVD) (typically at 200° to 450° for less than about two minutes). It is also possible to use an integrated oxygen plasma, in which case the wafer is placed in a second chamber a metallization tool where it is exposed to about 1% oxygen in argon. This step can be carried out as a preliminary step to the steps described above. By oxidizing in this manner for about 60 seconds, the free titanium can be burned as a seed layer to facilitate oxidation. The difficulties of forming an oxide layer in a vacuum chamber connected to a cryopump can be avoided due to the high dilution of oxygen in argon. Alternatively, chemical oxidation, for example electrochemical oxidation, can be employed.

Preferably the first insulating layer is formed on a conductive layer, such as a polysilicon layer, for establishing contact with said first electrode layer.

The insulating layer in which the holes are formed is typically an SG/PSG/SOG (Silicate Glass/Phosphorus-doped Silicate Glass/Spin-on Glass) sandwich. The PSG typically contains about 4 wt. % of phosphorus. The spin-on glass is preferably an organic spin-on glass containing about 4 wt. % of phosphorus.

The electrode layers can themselves be composite layers, for example TiN/Ti/TiN or Ti/TiN layers. Preferably, the lower layer consists of a Ti/TiN composite layer to make good contact with the underlying polysilicon contact layer. The upper layer is generally thicker, in the order of 2000Å, and is preferably in the form of a TiN/Ti/TiN sandwich. It is normally in tensile stress and TiN is normally in compressive stress, so the sandwich can be structured to reduce the stress in the electrode.

A integrated circuit structure can subsequently be formed in a conventional manner.

Although the dielectric layer can conveniently be titanium oxide, other dielectric layers, such as silicon nitride ($Si_3N_4$) can be used alone or in combination with the titanium dioxide layer. The silicon nitride layer can, for example, be deposited by PECVD (plasma enhanced chemical vapor deposition).

BRIEF DESCRIPTION OF THE DRAWINGS

The invention will now be described in more detail, by way of example only, with reference to the accompanying drawings, in which.

DESCRIPTION OF THE PREFERRED EMBODIMENT

Figure 1:
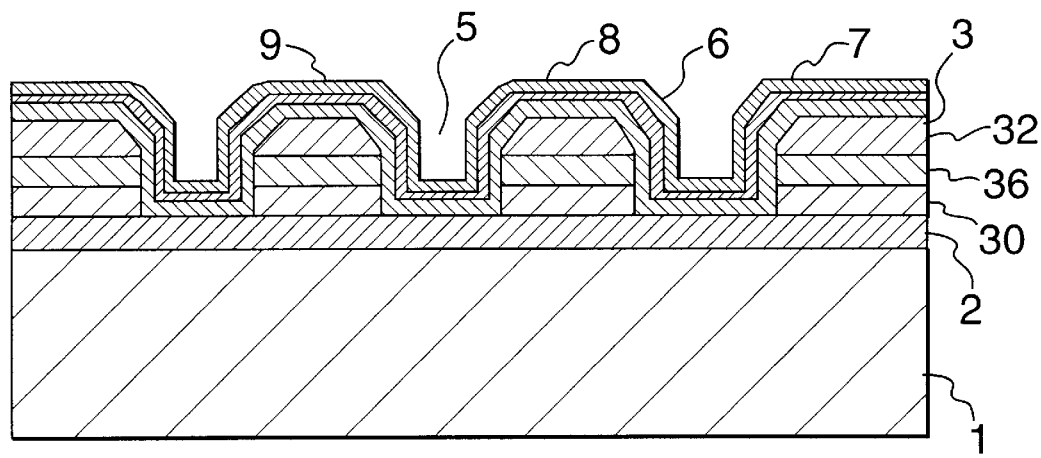
FIG. 1 is a schematic cross-sectional view of a semiconductor device with a capacitor formed thereon.

In FIG. 1, a silicon substrate 1 has various components, such as transistors and the like (not shown) formed therein by previous process steps known in the art. In order to provide high value capacitors 10 in the device, a layer of polysilicon 2 is first deposited on the surface of the wafer and patterned to provide a contact for the bottom electrode for the capacitor 10.

Next a composite layer 3 is deposited by conventional means onto the polysilicon layer 2. The insulating layer 3 typically consists of a lower layer of silicate glass, an intermediate layer of phosphorus-doped silicate glass (containing 4 wt. % P), and an upper layer of inorganic spin-on glass (also containing 4 wt. % P). The formation of such an insulating layer is conventional and well understood to a person skilled in the art. Layer 3 typically has a total nominal thickness of 0.8 micron.

After application of a first extra mask (not shown), a series of arrays of holes 5 are etched in the insulating layer 3. Each array will form a capacitor in a manner to be described. This mask is referred to as an extra mask because it involves a masking step over and above what would normally be required in conventional integrated circuit processing.

After bevelling the corners 6, for example, by carrying out an isotropic etch or an integrated sputter etch, a lower electrode 7 is sputtered onto the insulating layer 3 in a sputtering chamber initially in the presence of an inert gas, such as argon. The lower electrode layer 7 consists of a titanium layer followed by a titanium nitride layer. The lower Ti sublayer is preferred in order to make a good electrical contact with the underlying polysilicon layer 2. The titanium nitride layer can be deposited by changing the inert gas in the sputtering chamber to nitrogen. This electrode layer 7 typically has a total thickness of 0.01 to 0.1 microns.

Next the wafer is moved to a different system where a titanium oxide ($TiO_2$) layer 8 is formed, typically by thermal oxidation at 400–500° C. for less than about thirty seconds (or by plasma oxidation at about 200° C. for about 2 mins) on the titanium nitride sublayer. Alternatively, the oxide layer can be formed by rapid thermal oxidation (RTO) at 700° C. for about 1 minute. This oxide layer typically has a thickness of 50 to 1000 Angstroms.

As a preliminary step the free titanium can be oxidized in situ in the metallization tool. In that case, the wafer is transferred to a second chamber where it is placed in 1% of oxygen in argon plasma for about one minute. This creates a seed oxidation layer from the free titanium, which enhances subsequent oxidation.

Finally, the wafer is returned to the sputtering chamber, and the upper electrode layer 9, consisting of a TiN or preferably a TiN Ti/TiN sandwich is deposited. This upper layer 9 has a thickness of about 0.01 to 0.1 microns.

Since the dielectric layer 8 is deposited in a separate system, other suitable dielectrics can be employed, for example, silicon nitride ($Si_3N_4$), although this does not have as good dielectric properties as $TiO_2$. Another possibility is to employ a combination of $TiO_2$ and ($Si_3N_4$).

Figure 3:
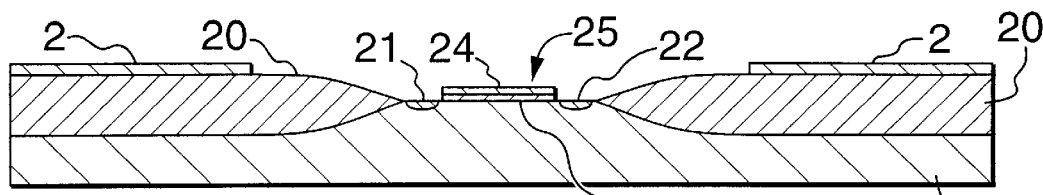
FIGS. 3 to 7 illustrate the various processing steps involved in fabricating capacitors in accordance with the invention.

FIG. 3 shows the wafer prior to the formation of the capacitors 10. The device has a field oxide layer 20 in the silicon substrate 1 and a transistor 25 having source 21, drain 22, gate oxide 23, and gate 24. The gate 24 is a polysilicon layer that is deposited with the contacts 2 as a common layer which is then patterned to make the bottom electrode contacts 2 and the gate electrodes 24.

Figure 4:
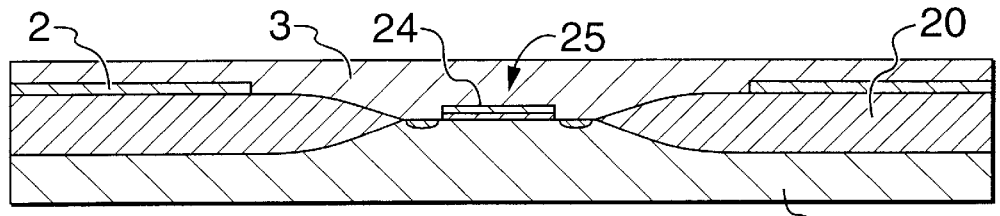
Figure 5:
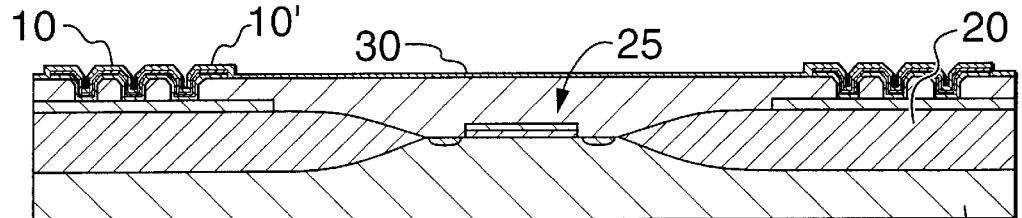
Figure 6:
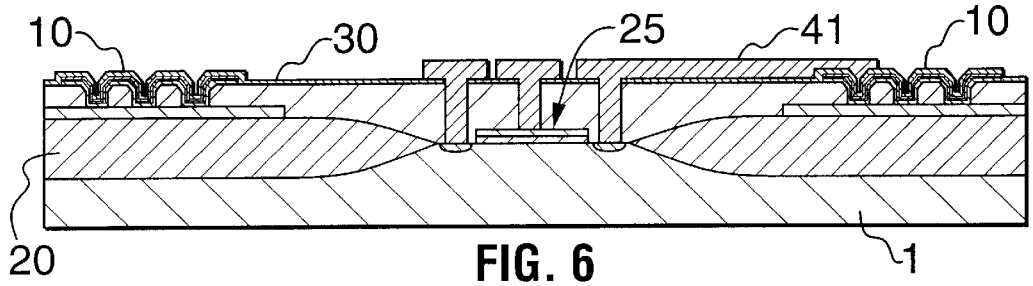

The SG/PSG/SOG layer 3 is then deposited as shown in FIG. 4 and the capacitors 10 formed as described with reference to FIG. 1.

After formation of the capacitors 10, the capacitor layers 7, 8, 9 of course extend across the whole wafer. The next step is to pattern the individual capacitors. As this step requires an additional mask over and above that normally used, this is considered a second extra masking step. A conventional mask can be employed.

Once formed, the capacitors 10 have been patterned, an isolation oxide layer 30 is applied across the whole wafer to give a structure as shown in FIG. 4. The isolation oxide layer is applied by PECVD to isolate the individual capacitors 10. This isolation layer is necessary to ensure that the edge 10' of the layers 7, 8, 9, of the capacitors 10 are protected against shorts when subsequent metal interconnect layers 41 are applied.

The next step is to mask the isolation layer 30 and etch holes 40 through the dielectric 3 to reach to the source, drain and gate regions of the transistors 1. This step is conventional. Subsequently, metal interconnect layer 41 (typically an aluminum alloy with a TiN anti-reflective coating) is applied onto isolation layer 30. The interconnect layer 41 ($M_1$ layer) extends into the holes 40 to establish contact with the source 21, drain 22, and gate 24 of the transistors 25. Contact to the electrodes of the capacitors is not yet established because the etching of the contact holes 40 would cause the penetration and complete etching of the upper electrode layer 9 of the capacitors because over-etching would occur due to the fact that the oxide layer 3 is at least ten times thicker over the transistors 25 than over the capacitors 10, resulting in a local destruction of the capacitors.

Figure 7:
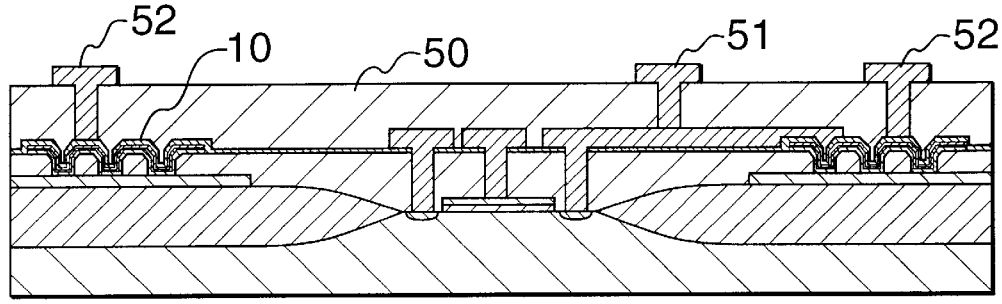

After patterning the layer 41 ($M_1$ layer), a further insulation layer 50 is applied as shown in FIG. 7. This layer consists of a conventional $ID_1$/SOG/$ID_2$ layer, where ID stands for interlayer dielectric. ID is typically SRSG (silicon rich silicon glass) and the SOG in this case is typically a semi-organic spin-on glass.

After applying insulation layer 50, a mask (not shown) is applied and via holes 51 are etched through the layer 50 to the upper electrode 9 of isolating the capacitors 10 and to the layer 41 where it is desired to establish interconnections. This is a standard procedure. Subsequently, a second aluminum interconnect layer 52 ($M_2$ layer) is applied over the layer 51. The $M_2$ layer is used in conventional i.c. processing to establish connections to the $M_1$ layer, and in this case is used additional to establish connection with the upper electrodes 9 of the capacitors. The layer 52 is subsequently patterned in a conventional manner.

Since the $M_1$ layer 41 is generally much thicker than the upper electrode layer 9, there is no risk of over-etching because the via holes 51 reach the interconnect layer 41 before they reach the thinner electrode layer 9. Etching can be terminated as soon as the holes reach electrode layer 9. There is thus no risk of an over-etch causing destruction of the capacitors, yet contact with both the electrode layer 9 and the interconnect layer 41 is assured.

Figure 8:
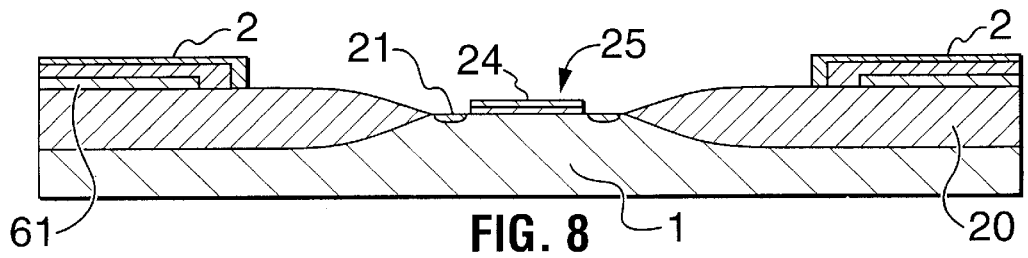
FIG. 8 shows an alternative embodiment.

FIG. 8 shows an alternative embodiment, where conventional capacitors 60 are formed prior to making the conformal capacitors 10 and then connected in parallel. In conventional i.c. technology, capacitors 60 are formed by first providing an additional poly layer 61 under the poly layer 2. A dielectric layer 62 is formed between the two poly layers 2, 61. In accordance with the invention, additional capacitors 10 can be formed on top of the conventional capacitors in a manner described above. The capacitors 10 and 60 are connected in parallel to create a composite capacitor having a capacitance equal to the sum of the two individual capacitances.

Figure 2:
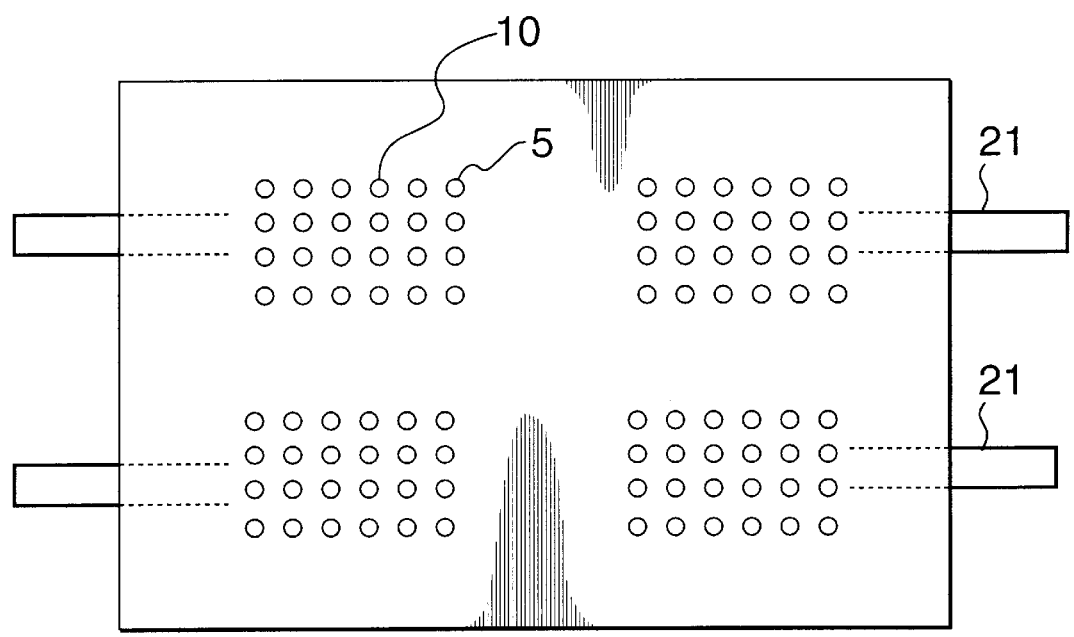
FIG. 2 is a plan view of a portion of a wafer having capacitors formed thereon.

FIG. 2 is a plan view of a portion of a wafer showing the capacitors 10 consisting of arrays of holes 5. Connection to the lower poly layers 2 is by means of connections 2'. The holes typically have a diameter and spacing of about 1 micron.

The described method permits high value capacitors to be formed in an economic manner with only two additional masking steps. The only extra masking steps required are the first extra mask to form the holes 5 and the second extra mask to pattern the capacitors. Extra deposition steps are required to form the capacitors, but the remaining connections are made using standard processing steps. The method is particularly suitable for working a 0.8 micron line widths and below. Also, the capacitors have metal electrodes, which lead to extremely good voltage coefficients.

We claim:

1. A method of making a semiconductor device with capacitors, comprising the steps of:

a) providing a first insulating layer on a wafer;

b) providing a first mask with an array of apertures over said insulating layer;

c) etching an array of holes in said first insulating layer through said apertures in said first mask;

d) forming a first electrode layer extending into said holes over said first insulating layer;

e) forming a dielectric layer extending into said holes on said first electrode layer;

f) forming a second electrode layer extending into said holes on said dielectric layer;

g) patterning said second electrode layer, said dielectric layer and said first electrode layer with a second mask to form said capacitors;

h) depositing an isolation layer on said wafer over said second electrode layer to isolate the edges of said first and second electrode layers;

i) etching first via holes through said isolation layer and first insulating layer to reach active components in the wafer;

j) applying a first metal layer over said isolation layer and said first insulating layer to contact said active components through said first via holes;

k) applying a second insulating layer over said first metal layer;

l) etching second via holes through said second insulating layer to reach said second electrode layer of said capacitors; and m) applying a second metal layer to contact said second electrode layer through said second via holes.

2. A method as claimed in claim 1, wherein said dielectric layer is formed in a separate chamber.

3. A method as claimed in claim 2, wherein said dielectric layer is formed by furnace oxidation.

4. A method as claimed in claim 3, wherein said dielectric layer is formed by plasma oxidation.

5. A method as claimed in claim 3, wherein said dielectric layer is formed by rapid thermal oxidation.

6. A method as claimed in claim 3, wherein an initial seed layer is formed by partial oxidation of the first electrode using an integrated oxygen plasma.

7. A method as claimed in claim 1, wherein said first and second metal layers are patterned after deposition.

8. A method as claimed in claim 1, wherein said first insulating layer is a composite layer.

9. A method as claimed in claim 1, wherein said composite layer comprises SG/PSG/SOG.

10. A method as claimed in claim 9, wherein said PSG contains about 4 wt. % of phosphorus and said SOG is an inorganic SOG containing about 4 wt. % of phosphorus.

11. A method as claimed in claim 1 to, wherein said first electrode layer comprises a Ti/TiN composite layer.

12. A method as claimed in claim 1, wherein said second electrode layer comprises a TiN/Ti/TiN composite layer.

13. A method as claimed in claim 1, wherein said dielectric layer is titanium oxide.

14. A method as claimed in claim 1, wherein said dielectric layer is silicon nitride.

15. A method as claimed in claim 1, wherein said dielectric layer is a composite layer comprising a titanium oxide sublayer and a silicon nitride sublayer.

* * * * *